(12) United States Patent
Card

(10) Patent No.: US 8,619,240 B2
(45) Date of Patent: Dec. 31, 2013

(54) ADAPTIVE RESPONSE TIME ACCELERATION

(75) Inventor: Robert A. Card, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 382 days.

(21) Appl. No.: 13/026,449

(22) Filed: Feb. 14, 2011

(65) Prior Publication Data

US 2012/0206711 A1   Aug. 16, 2012

(51) Int. Cl.
*G01C 3/08*   (2006.01)
(52) U.S. Cl.
USPC .......................................... 356/5.01; 356/5.1
(58) Field of Classification Search
USPC ............. 356/3.01–3.15, 4.01–4.1, 5.01–5.15, 356/6–22, 28, 28.5
See application file for complete search history.

(56) References Cited

U.S. PATENT DOCUMENTS

| 5,758,688 | A | | 6/1998 | Hamanaka et al. | |
|---|---|---|---|---|---|
| 5,808,728 | A | * | 9/1998 | Uehara | 356/5.01 |
| 6,580,497 | B1 | * | 6/2003 | Asaka et al. | 356/28.5 |

FOREIGN PATENT DOCUMENTS

CN   102692628 A   9/2012

OTHER PUBLICATIONS

"Chinese Application Serial No. 201210046875.6—Office Action Received", 10 pgs.
"Chinese Application Serial No. 201220067751.1, Office Action mailed Sep. 5, 2012", 3 pgs.
"Chinese Application Serial No. 201220067751.1, Response filed Oct. 30, 2012 to Office Action mailed Sep. 5, 2012", 35 pgs.

* cited by examiner

*Primary Examiner* — Luke Ratcliffe
(74) *Attorney, Agent, or Firm* — Schwegman Lundberg Woessner P.A.

(57) ABSTRACT

This document discusses among other things, methods and apparatus to conserve energy when providing proximity information. An example apparatus can include an energy emitter configured to emit a first pulse of energy, an energy sensor configured to receive reflected energy from the first pulse of energy, a control circuit including a processor, the processor configured to provide first proximity information of the apparatus with respect to an object using the reflected energy. The control circuit can be configured to control the energy emitter, to compare the first proximity information with second proximity information, and to modulate a delay between the first pulse of energy and a subsequent pulse of energy using the comparison.

18 Claims, 4 Drawing Sheets

ADAPTIVE RESPONSE TIME ACCELERATION

BACKGROUND

Proximity sensors are used in number of applications, for example, to sense the location of a particular device with respect to the location of a proximity sensor or to sense the relative proximity of an object with respect to a second object. A method of proximity sensing includes emitting energy and sensing reflected energy. The method can be repeated at a given frequency indefinitely to continuously monitor and provide proximity information. The proximity information can be used to control operation of a system the proximity sensor is used with.

Overview

In certain examples, methods and apparatus can conserve energy when providing proximity information. An example apparatus can include an energy source, such as an energy emitter, configured to emit a first pulse of energy, an energy sensor configured to receive reflected energy from the first pulse of energy, and a control circuit including a processor, the processor configured to provide first proximity information of the apparatus with respect to an object using the reflected energy. The control circuit can be configured to control the energy source, to compare the first proximity information with second proximity information, and to modulate a delay between the first pulse of energy and a subsequent pulse of energy using the comparison.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In certain examples, a proximity sensor can be used with an electronic device to control various features of the electronic device. For example, a proximity sensor can be used with a cell phone to help the usability of the cell phone by dimming the screen of the cell phone when the phone is near the user's face or when the cell phone screen is away from an object for an extended period of time. Such automated screen dimming can save a significant amount of battery energy. In some examples, proximity information from the sensor can be used to disable the cell phone screen when the phone is brought near the user's face, such that touching of the cell phone screen on the user's face does not trigger unintended keystrokes of the cell phone screen. In an example, the proximity sensor emits a pulse of energy and detects energy from the pulse reflected from an object near the sensor. The energy emission can be repeated at a fixed or other frequencies to provide on-going proximity information. The energy of the pulse can include, but is not limited to, light energy, such as visible or infrared light energy, acoustic energy, such as ultrasonic acoustic energy, or electromagnetic energy, such as radio frequency energy or inductive electromagnetic energy.

The inventors have recognized, among other things, that sensing proximity information at a constant frequency, for example, to disable a cell phone touch screen, wastes energy and reduces the useful charge life of an electronic device that relies on a limited power source, such as a battery. However, during some operations of a device, high speed proximity sensing can enhance the usability of a device because high speed proximity sensing can detect changes in the proximity between the devise and an object. Proximity information, including information indicating a change-in-proximity information, can be used to further enhance the usability of an electronic device. At the same time, however, on-going high speed sensing, such as when a cell phone is sitting on a night stand or is being used near the user's face during a conversation, wastes energy and can significantly reduce the useful charge lifetime if a device that relies on a limited power source such as a battery power source.

Figure 1:
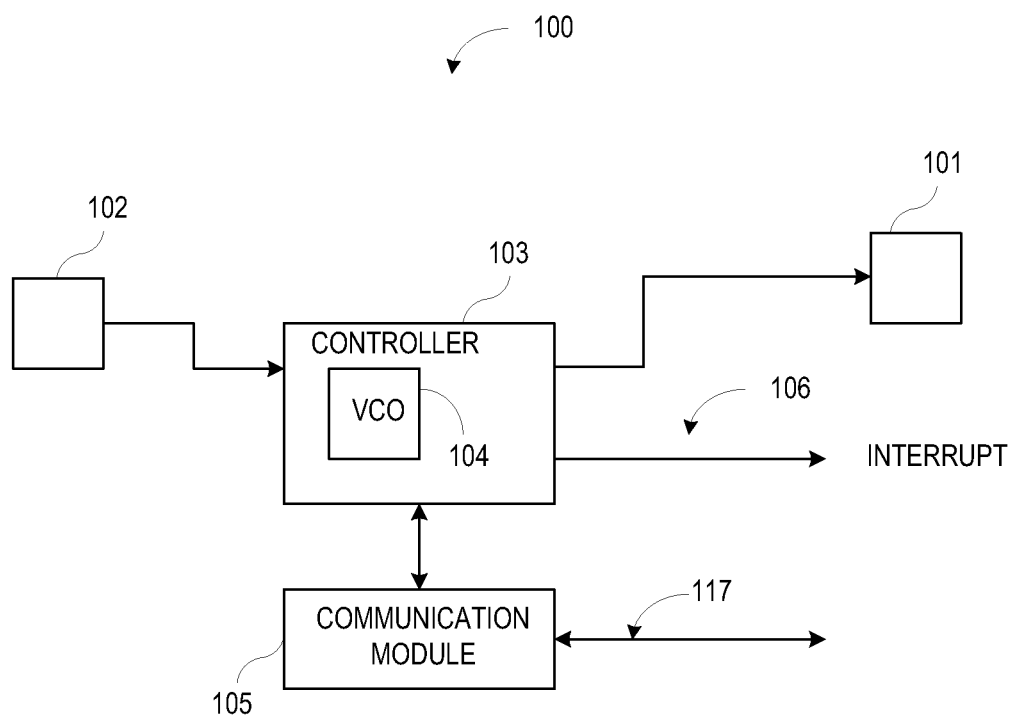
FIG. 1 illustrates generally an example of a proximity sensor.

FIG. 1 illustrates generally an example of a proximity sensor 100 according to the present subject matter. The proximity sensor 100 includes an energy emitter 101, an energy sensor 102, and a controller 103 configured to control the energy emitter 101 and receive information from the energy sensor 102. In certain examples, the energy emitter 101 can include a light source, such as a light emitting diode (LED), an acoustic emitter, such as an ultrasonic emitter, an electromagnetic emitter, such as a radio frequency emitter or an inductive emitter, or one or more other kinds of energy emitters. In certain examples, the energy sensor 102 can be selected to match the type of energy emitted from the energy emitter 101, such as an optical sensor, an acoustic sensor, or an electromagnetic sensor. The controller 103 can control and synchronize the energy emitter 101, energy sensor 102, or other control components to generate proximity information. In certain applications, the proximity sensor 100 can sense a change in proximity of an object near the proximity sensor 100 by comparing sense events. In some applications, timely and accurately sensing a change-in-proximity can provide increased performance of a device using a proximity sensor 100. Generally, better change-in-proximity measurements are provided when proximity is sensed at a higher frequency. Sensing proximity more frequently, however, uses more energy. For portable electronic devices, the energy source for powering the proximity sensor 100 can be a limited source, such as a battery.

In certain examples, the proximity sensor 100 can include an oscillator to provide a synchronization (sync) signal, for example, a clock signal, to control components of the proximity sensor 100 including the controller 103. Control components can use the sync signal to control emissions from the energy emitter 101 and determine proximity of an object based on information from the energy sensor 102, including information about energy from the energy emitter 101 reflected back to the energy sensor 102. In some examples, the oscillator can be an adjustable oscillator 104, such as a voltage-controlled oscillator (VCO). The adjustable oscillator 104 can vary the frequency of the sync signal in response to received control information, such as a voltage level. In an example, the controller 103 can provide information indicative of a change-in-proximity. The change-in-proximity information can be used to increase or decrease the frequency of the sync signal using the adjustable oscillator 104. In an example, when the change-in-proximity information indicates that an object is not present or is stationary relative to the proximity sensor 100, the oscillator frequency can be reduced to save consumption of energy by reducing the frequency of sensing proximity. When the change-in-proximity information indicates that an object has entered the sensing range of the proximity sensor 100 or that a sensed object is moving, the frequency of the oscillator 104 can be increased to provide more accurate change-in-proximity information.

In an example, the proximity sensor 100 can include a communication module 105. In an example, the proximity sensor 100 can be part of an integrated circuit and can include the communication module 105 for communicating over a bus 117, such as an inter-integrated circuit (I²C) communication bus.

In an example, the controller 103 can provide proximity information to other device components. For example, the controller 103 can communicate proximity information using the communication module 105. In an example, the controller 103 can provide an interrupt 106 to other device components when proximity information is available, or when the proximity information meets or exceeds predefined criteria.

Figure 2:
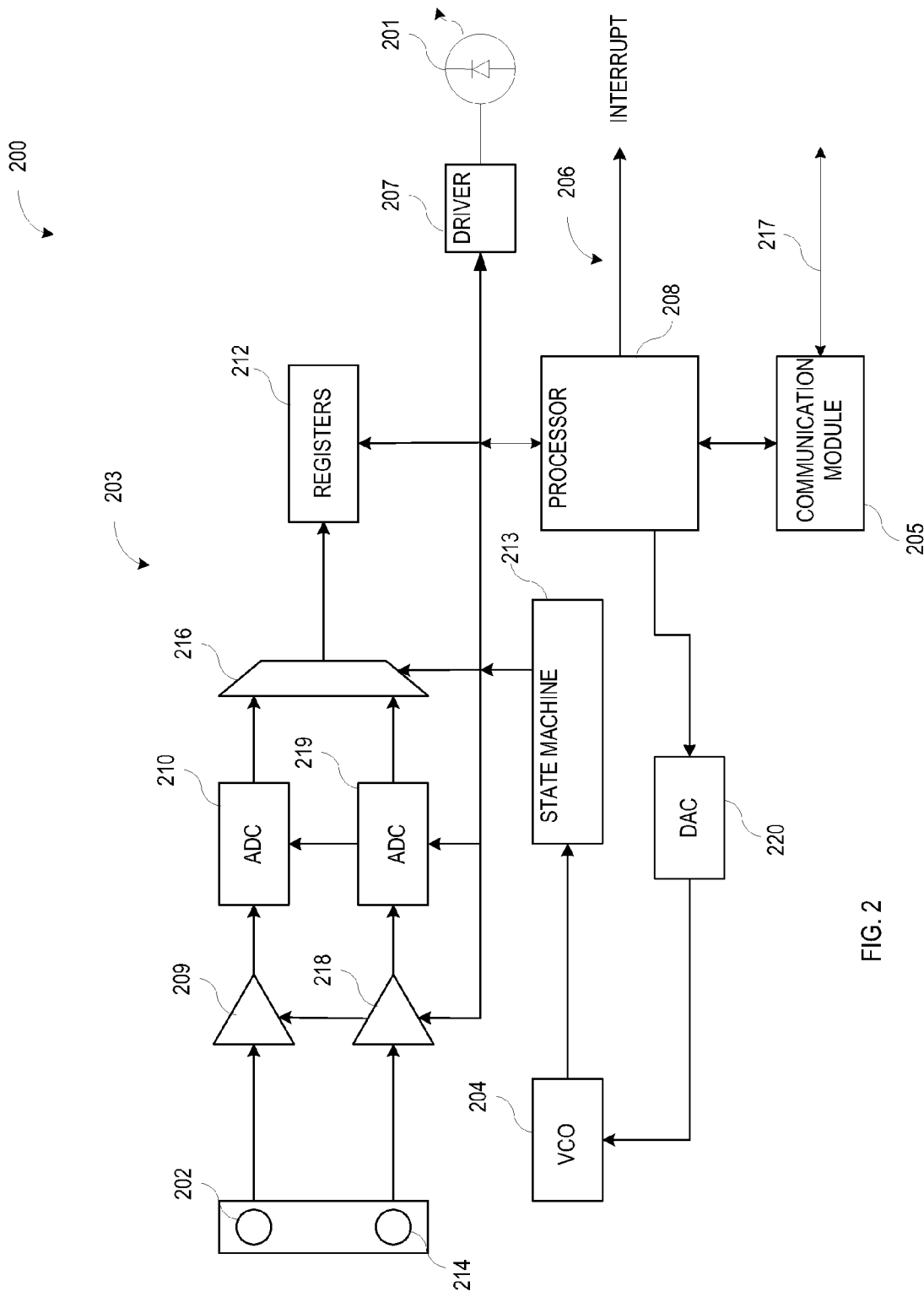
FIG. 2 illustrates generally an example of a proximity sensor.

FIG. 2 illustrates generally an example of a proximity sensor 200. The proximity sensor 200 can include an LED 201, an LED driver 207, a photo diode 202 sensitive to the light emitted by the LED 201, and a controller 203. The LED driver 207 can be configured to power the LED 201 "on" or "off" responsive to command information from the controller 203. The LED 201 can be configured to emit light when powered on by the LED driver 207. The photo diode 202 can be configured to receive light from the LED 201 reflected by an object proximate the LED 201 or the photo diode 202. The photo diode 202 can process the received light to provide sense information to the controller 203. The controller 203 can be configured to coordinate the operation of the LED 201 and to process sense information received from the photo diode 202 to provide, for example, to other components of a device using the proximity sensor 200, proximity information relative to the presence or absence of an object near the proximity sensor 200. In certain examples, the controller 203 can include a processor 208, such as a digital signal processor (DSP), to process the received sensor information and provide the proximity information, including change-in-proximity information, to other components of a device using the proximity sensor 200. In an example, the controller 203 can include an amplifier 209 coupled to the photo diode 202 to amplify information received from the photo diode 202, such as information in the form of a signal indicative of light received at the photo diode 202, including information relative to light corresponding to light emitted from the LED 201. In an example, a processing path of the proximity information can include an analog-to-digital converter (ADC) 210 to convert analog sense information received from the photo diode 202 to digital sense information. The controller 203 can include registers 212 to store processing information. In an example, the registers 212 can store historic proximity information to use for future processing. For example, change-in-proximity information can be provided by processing information from one or more past sense events. In an example, change-in-proximity information can use an average of the five most recent sense events. It is understood that more or less than five past sense events can be used to provide change-in-proximity information without departing from the scope of the current subject matter. In an example, the number of past sense events the sensor processes to determine change-in-proximity information can depend on the frequency of sensing proximity information. In an example a weighted average of past sense event information can be used to provide change-in-proximity information. In other examples, other sense events besides the most recent sense events can be used.

The controller 203 can include a state machine 213 to synchronize the control of the LED 201 and the sensing and processing of the sense information from the photo diode 202. In an example, the state machine 213 can reduce the processing burden of the processor 208 by controlling the sequencing of the LED 201, sampling of sensed information, and the transfer of the sensed information to the processor 208. In such an example, the processor 208 can utilize a low-power idle state until the state machine 213 makes the sense information available to the processor 208. Such an example can save energy by reducing the processing load of the processor 208.

In an example, the controller 203 can include an adjustable oscillator 204 to provide a sync signal to the state machine 213. The frequency of the adjustable oscillator 204 can be set based on change-in-proximity information received from the processor 208 of the controller 203. In an example, the frequency can be set using an analog signal and the controller can include a digital to analog converter (DAC) 220 to convert the change-in-proximity information from a digital format to an analog signal. For example, the adjustable oscillator 204 can include a voltage controlled oscillator (VCO) configured to output a pulse train at a frequency responsive to a received voltage level.

The adjustable oscillator 204, such as a VCO, can be configured to allow the proximity sensor 200 to conserve energy. For example, if an object is not detected by the proximity sensor 200 for an interval of time, or a sensed object has not changed in proximity relative to the proximity sensor 200 for an interval of time, the adjustable oscillator 204 can reduce the synchronization signal frequency. A reduction in synchronization signal frequency can reduce the frequency with which the state machine 213 triggers a sensing event, including reducing the frequency at which the LED 201 is turned "on". Cycling the LED 201 less often, which can operate at between 12.5 milliamps and 100 milliamps, can conserve a substantial amount of energy. The frequency of the adjustable oscillator 204 can increase to provide additional proximity information, as well as more timely change-in-proximity information, when the proximity sensor 200 first detects proximity to an object, or detects a sensed object moving.

In certain examples, the proximity sensor 200 can include an ambient light sensor 214, such as a photo diode sensitive to ambient visible light, to provide ambient light information. In an example, the controller can include a separate amplifier 218 to amplify the sensed ambient light information provided by the ambient light sensor 214. In certain examples, the controller 203 can include a separate ADC 219 to convert analog sense information received from the ambient light sensor 214 to digital sense information. In certain examples, the proximity photo diode 202 and the ambient light diode 214 can be integrated with each other. In an example, the controller 203 can include a multiplexer 216, responsive to the state machine 213. The multiplexer 216 can provide the appropriate sensed information to the processor 208, such that the processor 208 can provide either proximity information or ambient light information. In an example, the controller 203 can include an accumulator configured to operate with the multiplexer to coordinate routing sensed information to appropriate locations within the registers 212.

In an example, a proximity sensor 200 can include a communication module 205. In an example, an integrated circuit can include the proximity sensor 200 and can include a communication module 205 for communicating over a bus 217, such as an inter-integrated circuit ($I^2C$) communication bus, to other components of a device using the proximity sensor 200. It is understood that the proximity sensor 200 can include other communication modules supporting other communication protocols without departing from the scope of the present subject matter. In an example, the controller 203 can provide an interrupt 206 to other device components when proximity information is available, or when the proximity information meets or exceeds predefined criteria.

Figure 3:
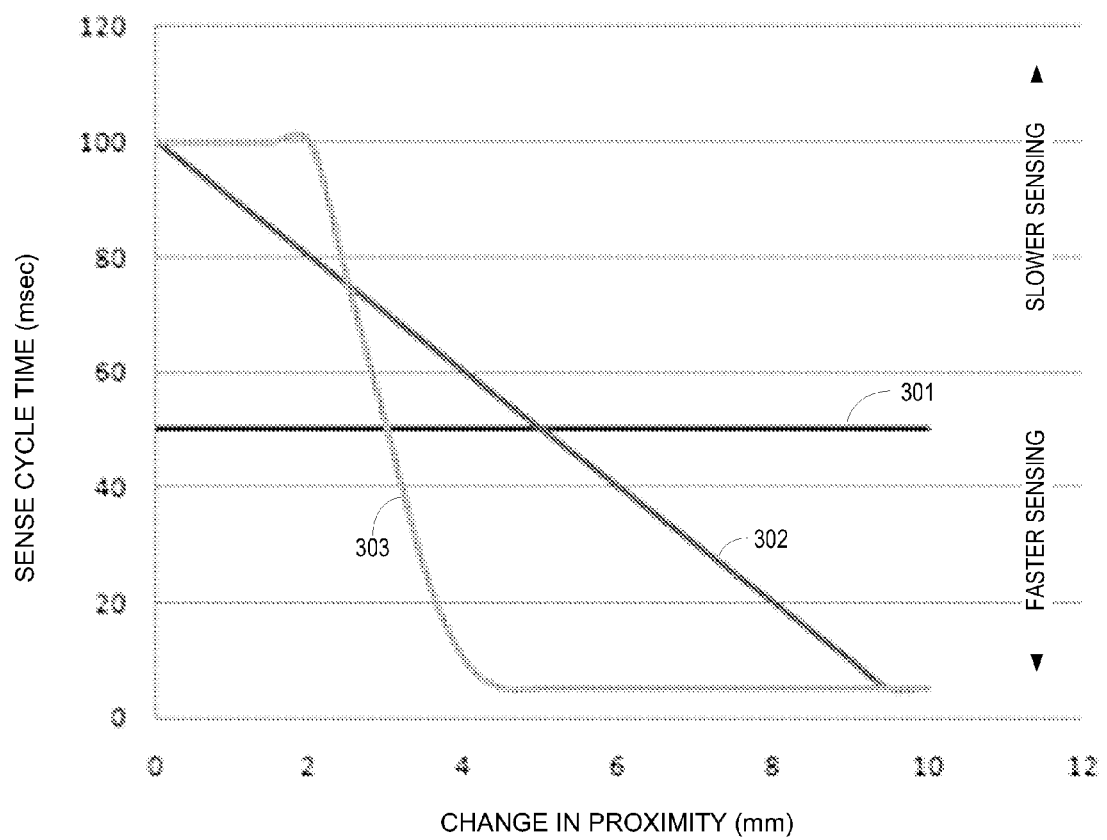
FIG. 3 illustrates generally a number of adaptive response time acceleration curves that can be used to control a proximity sensor.

FIG. 3 illustrates generally a number of adaptive response time acceleration curves that can be used to control a proximity sensor. The graph illustrates sensory cycle time, milliseconds, illustrated on the y-axis, as a function of change-in-proximity measured in distance, millimeters, illustrated on the x-axis. In certain examples, in a sensory cycle, a pulse of energy can be emitted from an emitter, reflected energy can be received at a sensor, the reflected energy can be digitized into proximity information, the digitized proximity information can be processed, the processed proximity information can be compared to one or more threshold values, an interrupt can be issued based on the comparison, and a communication module, such as an I2C communication module, can be serviced. In some examples, the frequency of an oscillator controlling the cycle time of the sensory cycle can be adjusted. As the sensory cycle time increases, the frequency of proximity sensing can decrease or become slower. As the sensory cycle time decreases, the frequency of proximity sensing can increase or become faster.

In some examples, a change in proximity information can be detected using several prior change-in-proximity measurements and may represent an accumulation of the prior measurements, an average of the prior measurements, or some other measurement algorithm. In an example, an adjustable oscillator, such as the adjustable oscillator 204 of FIG. 2, can be configured to operate at a fixed rate independent of the change in proximity of a sensed object, such as shown by the first curve 301. In an example, the adjustable oscillator can change frequency according to a linear function of change-in-proximity information as shown by the second curve 302. In an example, the adjustable oscillator can change frequency according to a non-linear function of change-in-proximity information as shown by the third curve 303.

In some examples, ambient light information received from an ambient light sensor can be processed in a sensory cycle, the processed ambient light information can be compared to one or more thresholds, and an interrupt based on the ambient light comparison can be issued. In some examples, the frequency of an oscillator controlling the cycle time of the sensory cycle can be adjusted in response to changes in ambient light. For example, if a level of ambient light has not substantially changed over a predetermined time, the cycle time can be increased to reduce the energy consumed by processing the ambient light samples at a slower frequency. On the other hand, if a substantial change in ambient light levels is sensed, the sensory cycle time can be reduced to sense the ambient light level more often such that conditions that depend on or are affected by ambient light, such as display backlighting, can be adjusted in a timely manner with the changing ambient light conditions.

Figure 4:
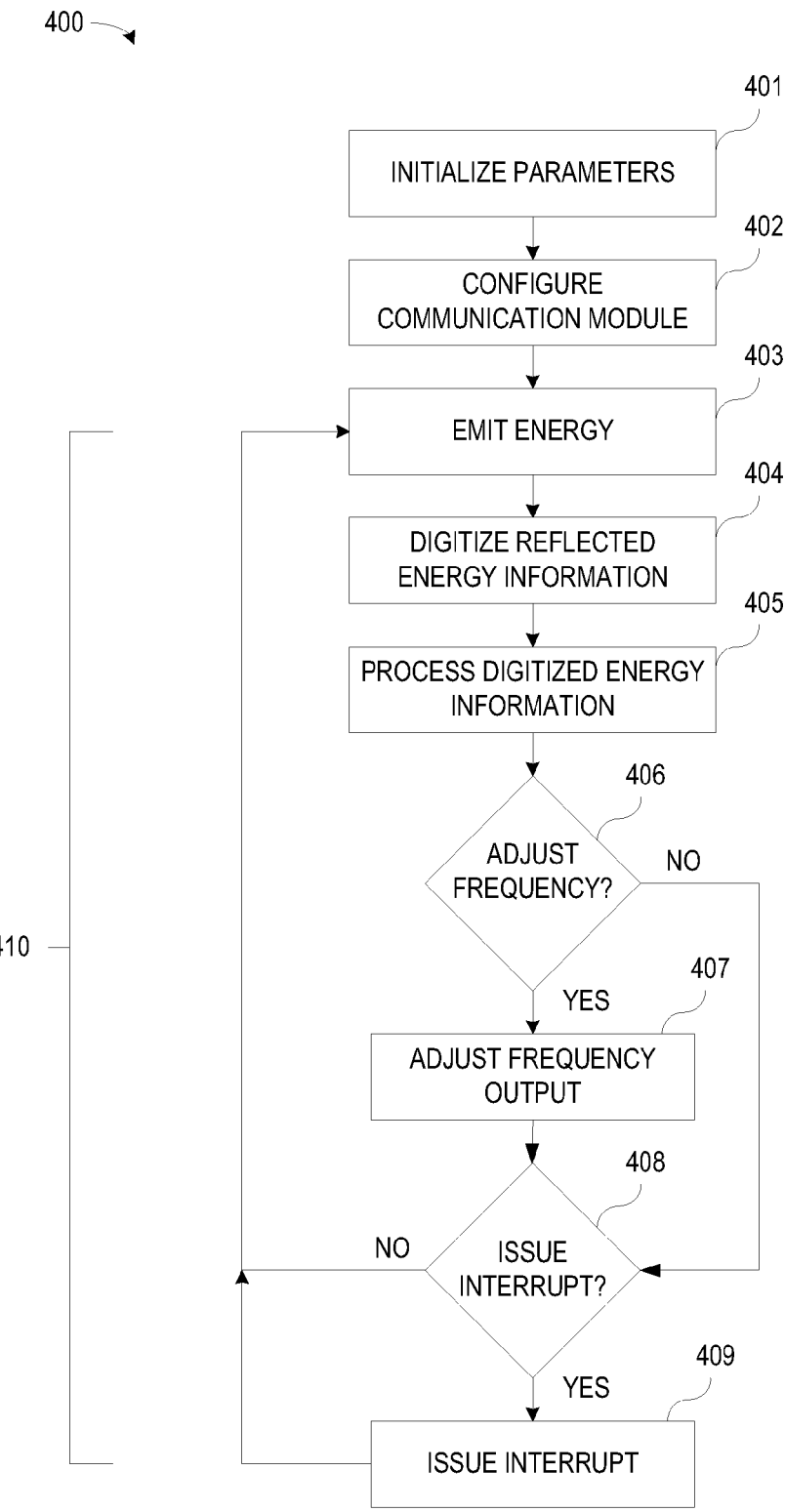
FIG. 4 illustrates generally an example of a method for efficiently providing timely and accurate proximity information.

FIG. 4 illustrates generally an example of a method 400 for efficiently providing timely and accurate proximity information. At 401, parameters can be initialized. At 402, a communication module, such as a serial chip-to-chip communication module, can be configured. At 403, a pulse of energy can be emitted from an energy emitter, such as a light source. At 404, reflected energy information received at a sensor can be digitized into proximity information. At 405, the digitized proximity information can be processed to determine actual proximity of an object to an apparatus or to determine a change in proximity of an object to an apparatus or a combination thereof.

At 406, change in proximity information can be used to evaluate whether to change a sensory cycle time. In an example, if the change-in-proximity information indicates that an object is moving near the apparatus of interest, the cycle time can be reduced to sense the proximity of the object faster, in turn, providing more accurate and timely information about the movement of the object. In an example, if the change-in-proximity information indicates an object is not present or has not moved very much during a interval of time with respect the apparatus of interest, the cycle time can be increased to save energy while still providing accurate and robust proximity information of the presence of any objects, or the proximity of a nearly stationary object, with respect to the apparatus of interest. In certain example, various thresholds can be used to determine when the cycle time can be increased or decreased. Such thresholds can be programmable, for example, using registers of the communication module. At 407, a frequency parameter can be adjusted. In an example, a value of an output register can be updated when the frequency register is updated. The output register can be coupled to a digital-to-analog converter (ADC) and an analog signal can set the frequency of an oscillator that controls the sequencing of the sensory cycle, and in turn, control the sensory cycle time.

At 408, the change in proximity information can be used to evaluate whether interrupt should be issued. At 409, an interrupt can be issued. After, at 408, whether an interrupt should be issued is evaluated, or, at 409, the interrupt is issued, a sensory cycle 410, including steps 403-409, can repeat. In an example, an interrupt can be used to alert other processes of proximity information, for example, using the communication module, or to take further action in response to the proximity information. Various thresholds can be used to determine if an interrupt should be issued. In an example, such thresholds can save energy by triggering other devices to read the proximity information only when a significant change in the proximity information is realized and not after each sensory cycle.

It is understood that other sensory cycles, either alone or in combination, are possible without departing from the scope of the present subject matter. For example, but not by way of limitation, proximity sensing and ambient light sensing can be combined in a sensory cycle and the sensory cycle time can be adjusted to accurately and timely sense proximity and ambient light conditions where such conditions are in flux, or can be adjusted to save energy consumption where those conditions are substantially unchanging.

Additional Notes

In Example 1, an apparatus can include a light source configured to emit a first pulse of light, a sensor configured to receive reflected light from the first pulse of light, a control circuit including a processor, the processor configured to provide first proximity information of the apparatus with respect to an object using the reflected light, wherein the control circuit is configured to control the light source, to compare the first proximity information with second proximity information, and to modulate a delay between the first pulse of light and a subsequent pulse of light using the comparison.

In Example 2, the second proximity information of Example 1 is optionally associated with a second pulse of light.

In Example 3, the control circuit of any one or more of Examples 1 or 2 is optionally configured to decrease the delay when the comparison indicates that the proximity of the apparatus to the object has changed by a first threshold distance.

In Example 4, the control circuit of any one or more of Examples 1-3 is optionally configured to increase the delay when the comparison indicates that the proximity of the apparatus to the object has not changed by a threshold distance.

In Example 5, the processor of any one or more of Examples 1-4 is optionally configured to provide an indication of a change in the proximity of the apparatus to the object.

In Example 6, the control circuit of any one or more of Examples 1-5 optionally includes an adjustable oscillator to control the delay.

In Example 7, the oscillator of any one or more of Examples 1-6 optionally includes a voltage-controlled oscillator.

In Example 8, the processor of any one or more of Examples 1-7 is optionally configured to provide a digital indication of the change-in-proximity of the apparatus to the object, and the control circuit of any one or more of Examples 1-7 optionally includes a digital-to-analog converter configured to receive the digital indication of the change-in-proximity, and to provide an analog voltage representation of the change-in-proximity to the voltage-controlled oscillator.

In Example 9, the light source of any one or more of Examples 1-8 optionally includes an infrared diode.

In Example 10, the second proximity information of any one or more of Examples 1-9 optionally includes a plurality of previous comparisons of proximity information.

In Example 11, A method can include emitting a first pulse of light from a light source, receiving reflected light from the first pulse of light, providing first proximity information of the apparatus with respect to an object using the reflected light, comparing the first proximity information with second proximity information, and modulating a delay between the first pulse of light and a subsequent pulse of light using the comparison.

In Example 12, the method of of any one or more of Examples 1-11 optionally includes receiving second reflected light from a second pulse of light, and providing the second proximity information of the apparatus with respect to the object using the second reflected light.

In Example 13, the modulating of any one or more of Examples 1-12 optionally includes decreasing the delay when the comparison indicates that the proximity of the apparatus to the object has changed by at least a first threshold distance.

In Example 14, the modulating optionally includes increasing the delay when the comparison indicates that the proximity of the apparatus to the object has not changed by more than a first threshold distance.

In Example 15, the providing the first proximity information of any one or more of Examples 1-14 optionally includes providing an indication of a change-in-proximity of the apparatus to the object.

In Example 16, the modulating the delay of any one or more of Examples 1-5 optionally includes modulating an oscillator frequency to control the delay using the indication of the change-in-proximity.

In Example 17, the providing the indication of the change-in-proximity of any one or more of Examples 1-16 optionally includes providing a digital representation of the change-in-proximity of the apparatus to the object.

In Example 18, the modulating the oscillator frequency of any one or more of Examples 1-17 optionally includes using the digital representation of the change-in-proximity of the apparatus to the object.

In Example 19, the modulating the oscillator frequency of any one or more of Examples 1-18 optionally includes converting the digital representation of the change-in-proximity of the apparatus to the object to an analog voltage signal, receiving the analog voltage at a voltage-controlled oscillator, and modulating an oscillator frequency of the voltage controlled oscillator using the analog voltage.

In Example 20, the comparing the first proximity information with second proximity information of any one or more of Examples 1-19 optionally includes comparing the first proximity information with a plurality of previous comparisons of proximity information.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20. These non-limiting examples can be combined in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
    a light source configured to emit a first pulse of light;
    a sensor configured to receive reflected light from the first pulse of light;
    a control circuit including a processor, the processor configured to provide first proximity information of the apparatus with respect to an object using the reflected light; and
    wherein the control circuit is configured to control the light source, to compare the first proximity information with second proximity information, and to modulate a delay between the first pulse of light and a subsequent pulse of light using the comparison; and
    wherein the control circuit is configured to increase the delay when the comparison indicates that the proximity of the apparatus to the object has not changed by a threshold distance.

2. The apparatus of claim 1, wherein the second proximity information is associated with a second pulse of light.

3. The apparatus of claim 1, wherein the control circuit is configured to decrease the delay when the comparison indicates that the proximity of the apparatus to the object has changed by a first threshold distance.

4. The apparatus of claim 1, wherein the processor is configured to provide an indication of a change in the proximity of the apparatus to the object.

5. The apparatus of claim 4, wherein the control circuit includes an adjustable oscillator to control the delay.

6. The apparatus of claim 5, wherein the oscillator includes a voltage-controlled oscillator.

7. The apparatus of claim 6, wherein the processor is configured to provide a digital indication of the change-in-proximity of the apparatus to the object; and
    wherein the control circuit includes a digital-to-analog converter configured to receive the digital indication of the change-in-proximity, and to provide an analog voltage representation of the change-in-proximity to the voltage-controlled oscillator.

8. The apparatus of claim 1, wherein the light source includes an infrared diode.

9. The apparatus of claim 1, wherein the second proximity information includes a plurality of previous comparisons of proximity information.

10. A method comprising:
    emitting a first pulse of light from a light source;
    receiving reflected light from the first pulse of light;
    providing first proximity information of the apparatus with respect to an object using the reflected light;
    comparing the first proximity information with second proximity information; and
    modulating a delay between the first pulse of light and a subsequent pulse of light using the comparison, wherein the modulating includes increasing the delay when the comparison indicates that the proximity of the apparatus to the object has not changed by more than a first threshold distance.

11. The method of claim 10, including:
    receiving second reflected light from a second pulse of light; and
    providing the second proximity information of the apparatus with respect to the object using the second reflected light.

12. The method of claim 10, wherein the modulating includes decreasing the delay when the comparison indicates that the proximity of the apparatus to the object has changed by at least a first threshold distance.

13. The method of claim 10, wherein the providing the first proximity information includes providing an indication of a change-in-proximity of the apparatus to the object.

14. The method of claim 13, wherein the modulating the delay includes modulating an oscillator frequency to control the delay using the indication of the change-in-proximity.

15. The method of claim 14, wherein the providing the indication of the change-in-proximity includes providing a digital representation of the change-in-proximity of the apparatus to the object.

16. The method of claim 15, wherein the modulating the oscillator frequency includes using the digital representation of the change-in-proximity of the apparatus to the object.

17. The method of claim 16, wherein the modulating the oscillator frequency includes:
    converting the digital representation of the change-in-proximity of the apparatus to the object to an analog voltage signal;
    receiving the analog voltage at a voltage-controlled oscillator; and modulating an oscillator frequency of the voltage controlled oscillator using the analog voltage.

18. The method of claim 10, wherein the comparing the first proximity information with second proximity information includes comparing the first proximity information with a plurality of previous comparisons of proximity information.

* * * * *